US010338154B2

(12) United States Patent
Sekitsuka et al.

(10) Patent No.: US 10,338,154 B2
(45) Date of Patent: Jul. 2, 2019

(54) MAGNETIC FIELD MEASURING APPARATUS, ELECTRONIC TIMEPIECE, METHOD OF SETTING CORRECTION OF MEASURED MAGNETIC FIELD AND COMPUTER-READABLE MEDIUM

(71) Applicant: CASIO COMPUTER CO., LTD., Tokyo (JP)

(72) Inventors: Tatsuya Sekitsuka, Kunitachi (JP); Naoto Toda, Tokorozawa (JP)

(73) Assignee: CASIO COMPUTER CO., LTD., Tokyo (JP)

(*) Notice: Subject to any disclaimer, the term of this patent is extended or adjusted under 35 U.S.C. 154(b) by 123 days.

(21) Appl. No.: 15/660,021

(22) Filed: Jul. 26, 2017

(65) Prior Publication Data
US 2018/0067173 A1 Mar. 8, 2018

(30) Foreign Application Priority Data

Sep. 7, 2016 (JP) .................. 2016-174190

(51) Int. Cl.
*G01R 33/00* (2006.01)
*G01R 33/02* (2006.01)
(Continued)

(52) U.S. Cl.
CPC ..... *G01R 33/0029* (2013.01); *G01R 33/0047* (2013.01); *G01R 33/02* (2013.01); *G04B 47/065* (2013.01); *G04G 21/02* (2013.01)

(58) Field of Classification Search
CPC ............ G01R 33/0029; G01R 33/0047; G01R 33/02; G04B 47/06; G04B 47/065;
(Continued)

(56) References Cited

U.S. PATENT DOCUMENTS 7,177,779 B2 * 2/2007 Hikida ................. G01C 17/28
342/140
7,743,519 B2 * 6/2010 Kou ....................... G01C 17/28
33/356
(Continued)

FOREIGN PATENT DOCUMENTS

JP            4391416 B2    12/2009
WO     WO 2004/003476 A1    1/2004

*Primary Examiner* — Yaritza Guadalupe-McCall
(74) *Attorney, Agent, or Firm* — Scully Scott Murphy & Presser

(57) ABSTRACT

A magnetic field measuring apparatus includes a first processor, a second processor, a motion sensor and a magnetic field sensor. The second processor has higher processing capability than the first processor. The first processor makes the second processor perform certain processing. When it is determined that the state of motion measured by the motion sensor is at a predetermined level or more, the second processor performs a magnetic field correction setting operation as one of the certain processing. The magnetic field correction setting operation involves retrieving measurement values of magnetic field from the magnetic field sensor which are measured at different postures according to a change of the state of motion, and determining an offset correction value for the geomagnetic field based on the measurement values.

20 Claims, 6 Drawing Sheets

(51) Int. Cl.
*G04B 47/06* (2006.01)
*G04G 21/02* (2010.01)

(58) Field of Classification Search
CPC ........ G04G 21/02; G04G 3/00; G01C 21/165;
G01C 21/3602; G01C 17/28; G01C
17/38; G01C 25/00; G01C 22/006; G01C
5/06
USPC .......................................................... 33/356
See application file for complete search history.

(56) References Cited

U.S. PATENT DOCUMENTS

| | | | |
|---|---|---|---|
| 9,068,832 B2* | 6/2015 | Heikkinen | G01C 17/28 |
| 10,041,795 B2* | 8/2018 | Sekitsuka | G01C 17/28 |
| 2008/0250661 A1* | 10/2008 | Kou | G01C 17/28 |
| | | | 33/356 |
| 2015/0233714 A1* | 8/2015 | Kim | G01C 17/38 |
| | | | 33/356 |
| 2016/0084652 A1* | 3/2016 | Sekitsuka | G01C 17/28 |
| | | | 702/94 |
| 2018/0067173 A1* | 3/2018 | Sekitsuka | G01R 33/0029 |

* cited by examiner

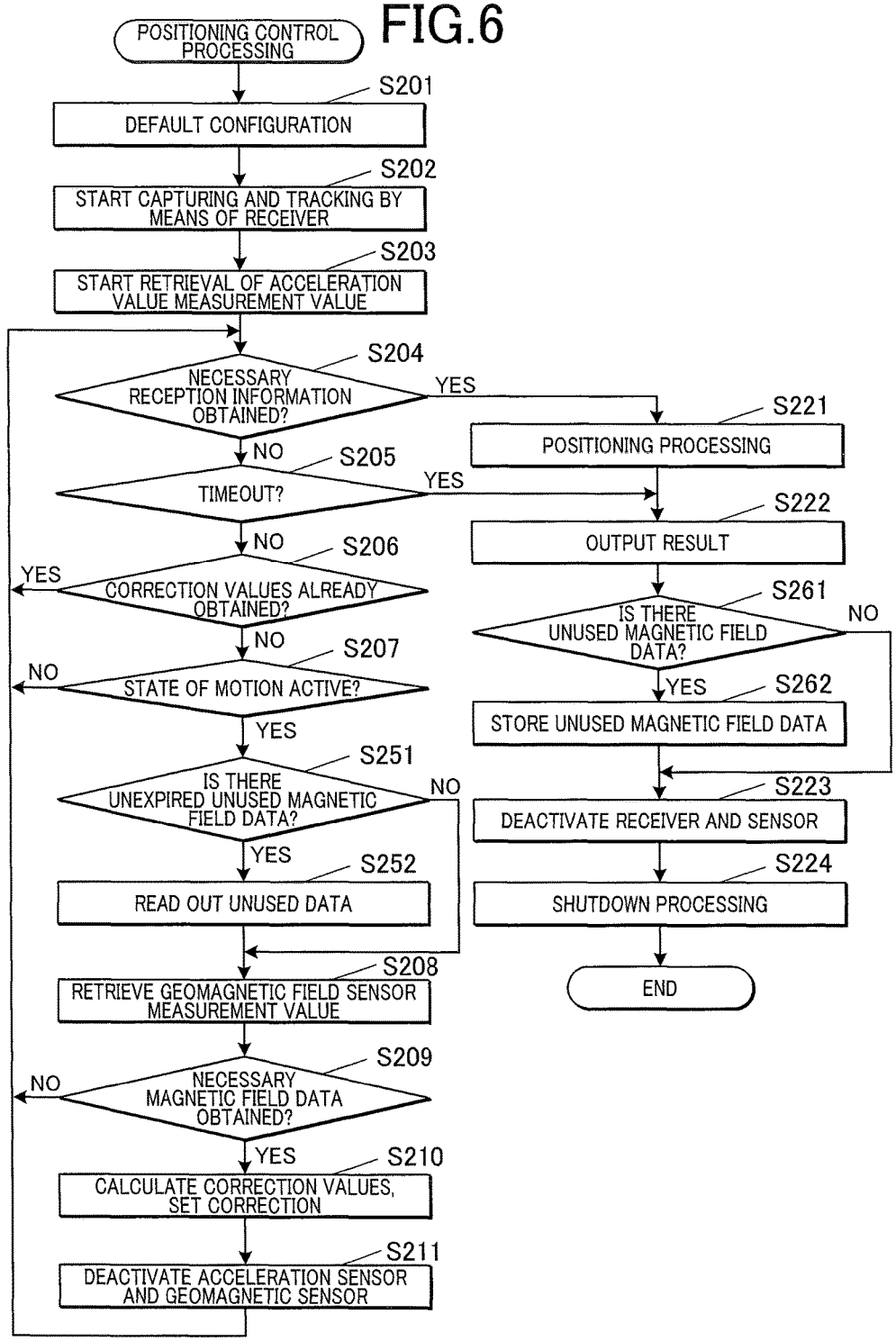

MAGNETIC FIELD MEASURING APPARATUS, ELECTRONIC TIMEPIECE, METHOD OF SETTING CORRECTION OF MEASURED MAGNETIC FIELD AND COMPUTER-READABLE MEDIUM

CROSS REFERENCE TO RELATED APPLICATION

This application is based upon and claims the benefit of priority under 35 USC 119 of Japanese Patent Application No. 2016-174190 filed on Sep. 7, 2016, the entire disclosure of which, including the description, claims, drawings and abstract, is incorporated herein by reference in its entirety.

BACKGROUND OF THE INVENTION

1. Field of the Invention

The present invention relates to a magnetic field measuring apparatus, an electronic timepiece, a method of setting correction of measured magnetic field, and a computer-readable medium.

2. Description of Related Art

There have been electronic devices (magnetic field measuring apparatuses) with a sensor (geomagnetic sensor) that measures a magnetic field, particularly the geomagnetic field and outputs a signal corresponding to the measurement result. The measurement result by the geomagnetic sensor is used for a function as a compass that indicates the magnetic north and may sometimes further be used for detection and determination of the posture, the moving direction and the like of the devices.

If there is a magnet or a magnetized object in the vicinity of a magnetic field measuring apparatus, it measures the combined magnetic field of the magnetic field developed by such objects with the geomagnetic field. In particular, when a component of the magnetic field measuring apparatus is magnetized, it creates an offset magnetic field that is constant with respect to the measuring axes. In order to measure the magnetic field accurately, it is necessary to determine the significance of the offset magnetic field and to correct the measurement value according to the offset magnetic field.

Some components of an electronic device are magnetized or experiences a change of the degree of magnetization due to the operation of the electronic device or the like as time goes by. Therefore, electronic devices require suitable update of the correction data. However, a problem in the prior art is that determination of the offset magnetic field is often not made for a long time since it requires a predetermined user operation which is troublesome and puts a burden on the user. To cope with the problem, WO 2004/003476A discloses a technique for suitably obtaining a correction value while facilitating a required user operation, which involves making measurements in different postures while changing the posture of a geomagnetic field detecting means of an azimuth measuring apparatus, i.e. moving and rotating the azimuth measuring apparatus, and statistically determining deviation of the center of the values measured by the geomagnetic field detecting means.

However, the above-described technique eventually requires a user labor such as intentionally changing the posture. Furthermore, the processing of statistically calculating a correction value requires a larger amount of computing and higher memory capacity compared to typical processing of measuring the magnetic field or calculating the bearing. In an electronic device that is tailored to a low-load normal processing, the user is required to make a motion continuously during the calculation. On the other hand, providing a processor with high processing capability for the calculation of a correction value and using the processor constantly will cause a problem of low operational efficiency.

SUMMARY OF THE INVENTION

It is an object of the present invention to provide a magnetic field measuring apparatus, an electronic timepiece, a method of setting correction of a measured magnetic field and a computer-readable medium that enables efficiently obtaining suitable correction data for a measured magnetic field with a less burden on the user.

To achieve at least one of the abovementioned objects, according to an aspect of the present invention, there is provided a magnetic field measuring apparatus, including:

a first processor;

a second processor which has higher processing capability than the first processor;

a motion sensor which measures state of motion of the apparatus; and a magnetic field sensor which measures a magnetic field, wherein the first processor makes the second processor perform certain processing, and wherein when it is determined that the state of motion measured by the motion sensor is at a predetermined level or more, the second processor performs a magnetic field correction setting operation as one of the certain processing, in which the magnetic field correction setting operation involves retrieving measurement values of the magnetic field from the magnetic field sensor which are measured at different postures according to a change of the state of motion, and determining an offset correction value for the geomagnetic field based on the measurement values.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention, and wherein:

FIG. 6 is a flowchart of a variation of the control process of the positioning control processing, which is performed by the satellite radio signal receiver processor.

DETAILED DESCRIPTION OF THE PREFERRED EMBODIMENTS

Hereinafter, an embodiment of the present invention will be described based on the drawings. However, the scope of the invention is not limited to the disclosed embodiments.

Figure 1:
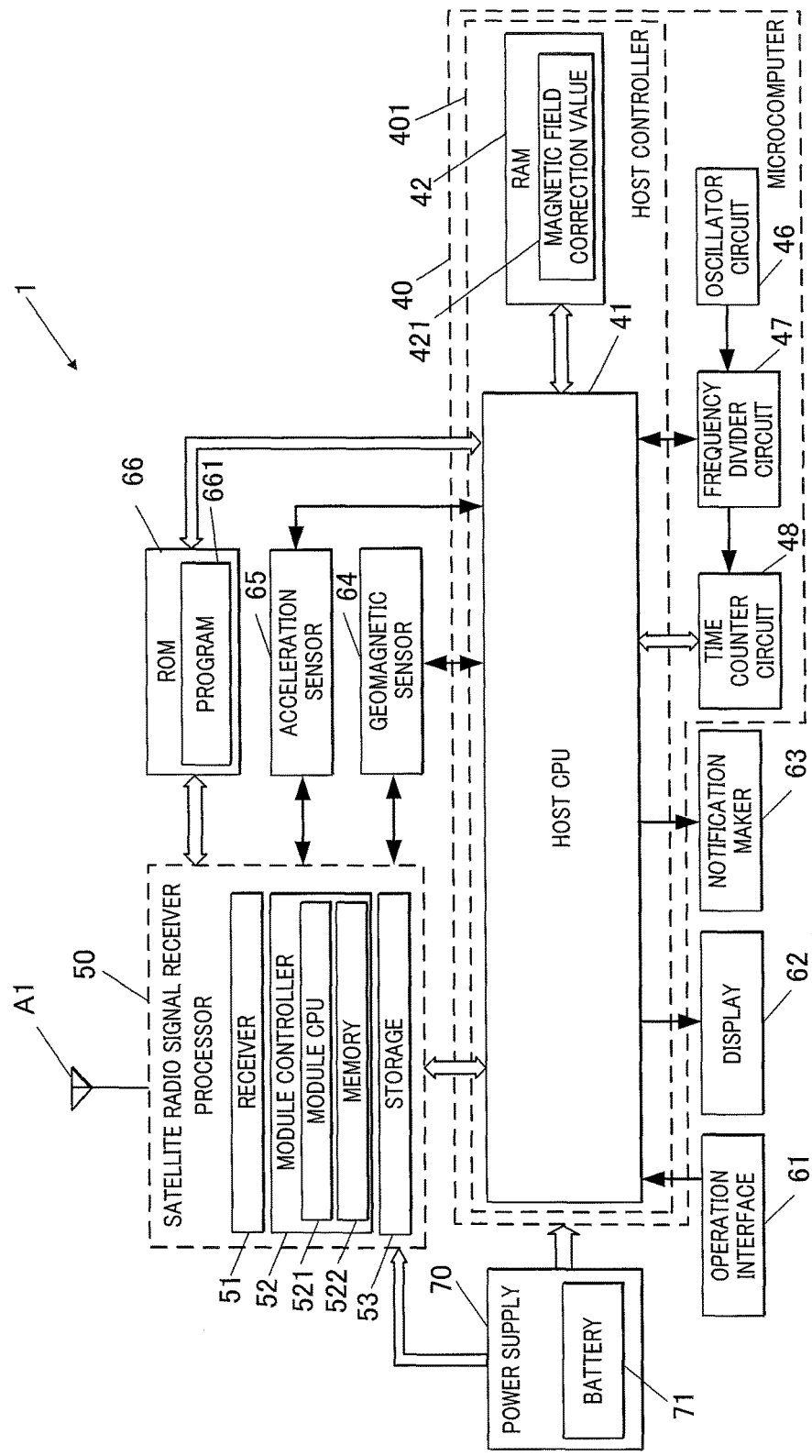
FIG. 1 is a block diagram illustrating the functional configuration of an electronic timepiece of an embodiment.

FIG. 1 is a block diagram illustrating the functional configuration of an electronic timepiece 1 of the embodiment.

For example, the electronic timepiece 1 of the embodiment is an electronic wrist watch with a band, which is worn on the arm of a user by means of the band.

The electronic timepiece 1 includes a microcomputer 40, a satellite radio signal receiver processor 50, an antenna A1, an operation interface 61, a display 62, a notification maker 63, a geomagnetic sensor (magnetic field sensor) 64, an acceleration sensor (motion sensor) 65, a ROM (Read Only Memory) 66, a power supply 70 and the like.

The microcomputer 40 includes a host CPU (Central Processing Unit) 41, a RAM (Random Access Memory) 42, an oscillator circuit 46, a frequency divider circuit 47, a time counter circuit (time counting section) 48 and the like.

The host CPU 41 performs various processing. The processing by the host CPU 41 is mainly related to counting and displaying the date and time for a timepiece function of the electronic timepiece 1, which is low-load processing performed continuously and repeatedly for a long time. For this processing, the host CPU 41 is adapted to have lower processing capability than a module CPU 521 of the satellite radio signal receiver processor 50. The host CPU 41 is capable of giving a command to the module CPU 521 to selectively perform a certain high-load processing (module controller 52). Such processing is predetermined in the embodiment, and the programs and the like for the processing is stored in the storage 53, the ROM 66 or the like so that the module CPU 521 (module controller 52) can perform it immediately.

The RAM 42 provides a working memory area for the host CPU 41 and stores temporary data and configuration data. The configuration data includes magnetic field correction values 421, which are described later.

The CPU 41 and the RAM 42 constitute a host controller 401 (first processor).

The oscillator circuit 46 generates and outputs signals at predetermined frequency. For example, a quartz oscillator is used to generate the signals. Such a quartz oscillator may be externally connected to the microcomputer 40.

The frequency divider circuit 47 outputs frequency dividing signals that divide the frequency signals input from the oscillator circuit 46 at a predetermined dividing ratio. The dividing ratio may be changed by the host CPU 41.

The time counter circuit 48 counts and retains the current date and time (at least the current time) by counting the frequency dividing signals with a predetermined frequency input from the frequency divider circuit 47. The current date and time counted by the time counter circuit 48 can be corrected (controlled) according to a control signal from the host CPU 41 based on the accurate current date and time obtained by the satellite radio signal receiver processor 50 or the like. The time counter circuit 48 may be constituted by a hardware such as a counter. Alternatively, the host CPU 41 along with the RAM 42 may perform the time counting operation of the time counter circuit 48 by means of a software.

The satellite radio signal receiver processor 50 is constituted by a module that is configured mainly to receive a radio signal (satellite radio signal) transmitted from positioning satellites of a satellite positioning system such as GPS of United States of America through the antenna A1 so as to obtain date and time information (current date and time information) and information on the position of a positioning satellite (orbital information such as the ephemeris and information on the position and the speed) and to calculate the accurate current date and time and the accurate current position (i.e. to perform positioning) based on the information (positioning information) to output it to the host CPU 41. The satellite radio signal receiver processor 50 includes a receiver (satellite radio signal receiver) 51, the module controller (second processor) 52, a storage 53 and the like, which are integrated as an LSI. The satellite radio signal receiver processor 50 may include its own oscillator circuit and frequency divider circuit (not shown), particularly those having high oscillating frequency, independently from the oscillator circuit 46 and the frequency dividing circuit 47.

The receiver 51 receives and detects a radio signal from a target positioning satellite so as to perform a capturing operation including identification of the positioning satellite and determination of the phase of the sent signal. The receiver 51 also tracks the radio signal of the captured positioning satellite so as to continuously demodulate and obtain signals.

The module controller 52 mainly controls the reception of satellite radio signals, and determines the current date and time and calculates the current position (i.e. performs positioning) based on the received signals. The module controller 52 can perform other processing based on a command from the host CPU 41. The module controller 52 includes a module CPU 521, a memory 522 and the like.

The module CPU 521, which performs various processing, controls the operation of the satellite radio signal receiver processor 50. The module CPU 521 (module controller 52) has higher processing capability than the host CPU 41 (host controller 401) and is capable of performing high-load processing such as the above-described positioning that is a higher load compared to the counting and displaying operation of the date and time. Accordingly, the power consumption of the module CPU 521 is higher than the power consumption of the host CPU 41 when they perform similar processing. Between the module CPU 521 and the host CPU 41, a connection with high power consumption efficiency such as an $I^2C$ bus is established.

The memory 522 includes a volatile memory such as a DRAM or a SRAM for providing a working memory area (including a cache memory) for the module CPU 521, a ROM for storing default configuration data etc., and the like. The ROM may be constituted by a mask ROM or a rewritable non-volatile memory. The capacity of the volatile memory of the memory 522 is larger than the capacity of the RAM 42, and the power consumption thereof required for refreshing itself or the like is higher accordingly.

The storage 53 is constituted by an auxiliary storage device, in which various configuration data, history data, programs and the like are stored and retained regardless of the power supply condition. The storage 53 is constituted by a flash memory or the like.

Power supply from the power supply 70 to the satellite radio signal receiver processor 50 is configured to be switchable between on and off independently from the components related to the timepiece function including the host CPU 41.

The operation interface 61 receives an external input such as a user operation. For example, the operation interface 61 includes at least one push button switch and outputs a signal to the host CPU 41 according to a user operation of pressing the push button switch.

The display 62 displays various information by a control of the host CPU 41. The display 62 includes a display panel and a driver circuit for the display panel. For example, the display panel is constituted by a liquid crystal display (LCD) panel, and the driver circuit drives the liquid crystal display panel to display various screens. The contents to be displayed on the display 62 include information on the current date and time (i.e. an indication of the date and time, at least the time) and an indication of the direction of the magnetic north component in the plane of the display panel (i.e. an electronic compass).

The notification maker 63 makes various notifications to the user. Mechanisms that can be used to make notifications include a speaker, a piezoelectric element for generating a beep, a vibration motor and the like.

The geomagnetic sensor 64 is constituted by a magnetic field sensor that measures the magnetic field in the three axes at the resolution and within the magnetic field intensity range corresponding to the geomagnetic field. For example, a magnetoresistive element (MR element) is used to measure the magnetic field, and the measurement values are output as electric signals to the host CPU 41 and the module CPU 521. The destination is changeable according to the setting or the operational status of the host CPU 41 and/or the module CPU 521.

The acceleration sensor 65 measures the acceleration in the three axes, i.e. the state of motion of the electronic timepiece 1. Such acceleration sensors include, but are not specifically limited to, sensors that utilize deformation of a piezoelectric element caused by acceleration, and the like. The measurement values by the acceleration sensor 65 are output as electric signals to the host CPU 41 and the module CPU 521. The destination is changeable according to the setting and the operational status of the host CPU 41 and/or the module CPU 521 independently from the output of the measurement values by the geomagnetic sensor 64.

The ROM 66 stores a program 661, default configuration data and the like that are used by the host CPU 41 and the module CPU 521 to perform various processing. The ROM 66 is configured to be accessible for both the host controller 401 and the module controller 52. The ROM 66 may include a rewritable non-volatile memory such as a flash memory as well as a mask ROM.

The power supply 70 supplies electric power to the components of the electronic timepiece 1, which is used for the operation thereof. The power supply 70 distributes electric power output from a battery 71 at the respective operation voltages of the components. When the operation voltages vary depending on the components, the power supply 70 converts the output voltage by means of a regulator. As the battery 71, the power supply 70 may include a solar panel for generating electric power from incident light and a secondary battery for storing the generated electric power. Alternatively, a dry-cell battery or a rechargeable battery may be detachably put in a power supply 70.

Among the above-described components, the host controller 401, the module controller 52, the geomagnetic sensor 64 and the acceleration sensor 65 constitute a magnetic field measuring apparatus.

Next, measurement of the magnetic field by the electronic timepiece 1 of the embodiment will be described.

In the electronic timepiece 1 of the embodiment, the geomagnetic sensor 64 can measure the magnetic field respectively in the three axes that are perpendicular to each other as described above. In the embodiment, it measures the magnetic field in the two axes that are parallel to the plane of the display panel and are perpendicular to each other and in the single axis that is perpendicular to the display panel, and then calculates the total magnetic field direction and the intensity thereof. When the calculated magnetic field intensity falls within a proper range, the geomagnetic sensor 64 determines the total magnetic field direction as the direction of the magnetic north.

In the embodiment, the geomagnetic field measurement is started in response to the detection of a predetermined user operation of pressing the push button switch. The measurement is repeated for plural times at predetermined time intervals during a predetermined measurement period, and the direction of the magnetic north is determined in each measurement. When a compass function is enabled, the host controller 401 calculates the in-plane direction of the magnetic north in the plane of the display panel, and the calculated direction of the magnetic north is displayed on the display 62.

When the direction of the magnetic north is largely inclined with respect to the display panel (when the direction of the magnetic north is nearly perpendicular to the display panel), the detection accuracy (determination accuracy) of direction of the magnetic north is deteriorated. To address the problem, when the direction of the magnetic north is within a predetermined angle with respect to the perpendicular direction to the display panel, a caution may be displayed, or the indication of the direction of the magnetic north may be hidden. Further, when there is a strong magnetic field source, a magnetic shielding structure or the like in the vicinity, the intensity of a measured magnetic field becomes extremely large or weak compared to the intensity of the geomagnetic field, or the intensity and the direction of the measured magnetic field becomes instable due to an alternating-current magnetic field. In such cases, a notification that the magnetic field measurement is inaccurate may be displayed.

The display resolution of the magnetic north direction may be changeable according to an input of a user operation on the operation interface 61. For example, the display unit of the electronic timepiece 1 is changeable between 45-degree increments (8 directions) and 12-degree increments (30 directions). Since the detection accuracy of the magnetic north direction has to correspond to the display resolution, the criterion of the detection accuracy is changed according to the display resolution.

When a component of the electronic timepiece 1 is in a magnetized condition at the time of the magnetic field measurement, the geomagnetic sensor 64 measures the sum of the magnetic field generated by the component and the geomagnetic field. In a period of several days to several months, the magnetic field by a magnetized component is regarded as an offset magnetic field that always acts in the same direction at the same intensity with respect to the posture of the electronic timepiece 1, i.e. the three axes the geomagnetic sensor 64 unless there is an event that causes another magnetization or demagnetization such as contact of the electronic timepiece 1 with a magnet. Accordingly, it is possible to obtain the geomagnetic field by determining and storing the significance of the offset magnetic field in the three axes as correction values and subtracting them from the measurement values (measured magnetic field) in the three axes. In the embodiment, for example, the offset magnetic field is stored in the RAM 42 as magnetic field correction values 421 so that they can be referenced by the host CPU 41. Alternatively, they may be stored in the flash memory of the ROM 66 or the like so that they can also be referenced and used by the satellite radio signal receiver processor 50.

Next, determination of the correction values of the offset magnetic field will be described.

Since the correction values of the offset magnetic field are constant in the respective three axes as described above, it is possible to obtain them by measuring the magnetic field in various positions so that the direction of the geomagnetic field varies with respect to the three axes and calculating the direction of the average deviation. To determine the direction of the average deviation, any one of various methods known in the art is selected and used. That is, various methods using a regression/fitting technique may be employed, by which an offset value that is subtracted from original values to yield the minimum dispersion is determined.

The electronic timepiece 1 of the embodiment detects a motion at a predetermined level or more (the state of motion) caused by a swing of the user arm or the like and measures the magnetic field by means of the geomagnetic sensor 64 in different directions (two or more postures) according to a change of the state of motion, so as to obtain the measurement values. It is preferred that the change of the direction (significance of the swing of the arm) is large and wide. An example of such situation is that the user walks or runs without anything held in his/her hand (arm) on which the wrist watch is worn. In the electronic timepiece 1, the criterion of detecting the state of motion may be suitably adjusted so that the determination of the correction values is performed only when the change of the direction is large or even when a swing is small.

In the electronic timepiece 1 of the embodiment, the module CPU 521 along with the memory 522 performs the processing (magnetic field correction setting operation) for the determination of the offset values of the magnetic field (determination of the offset correction values for the geomagnetic field) according to a command from the host CPU 41. The timing of this execution command may be selected so that other processing is performed in parallel by the module CPU 521.

Figure 2:
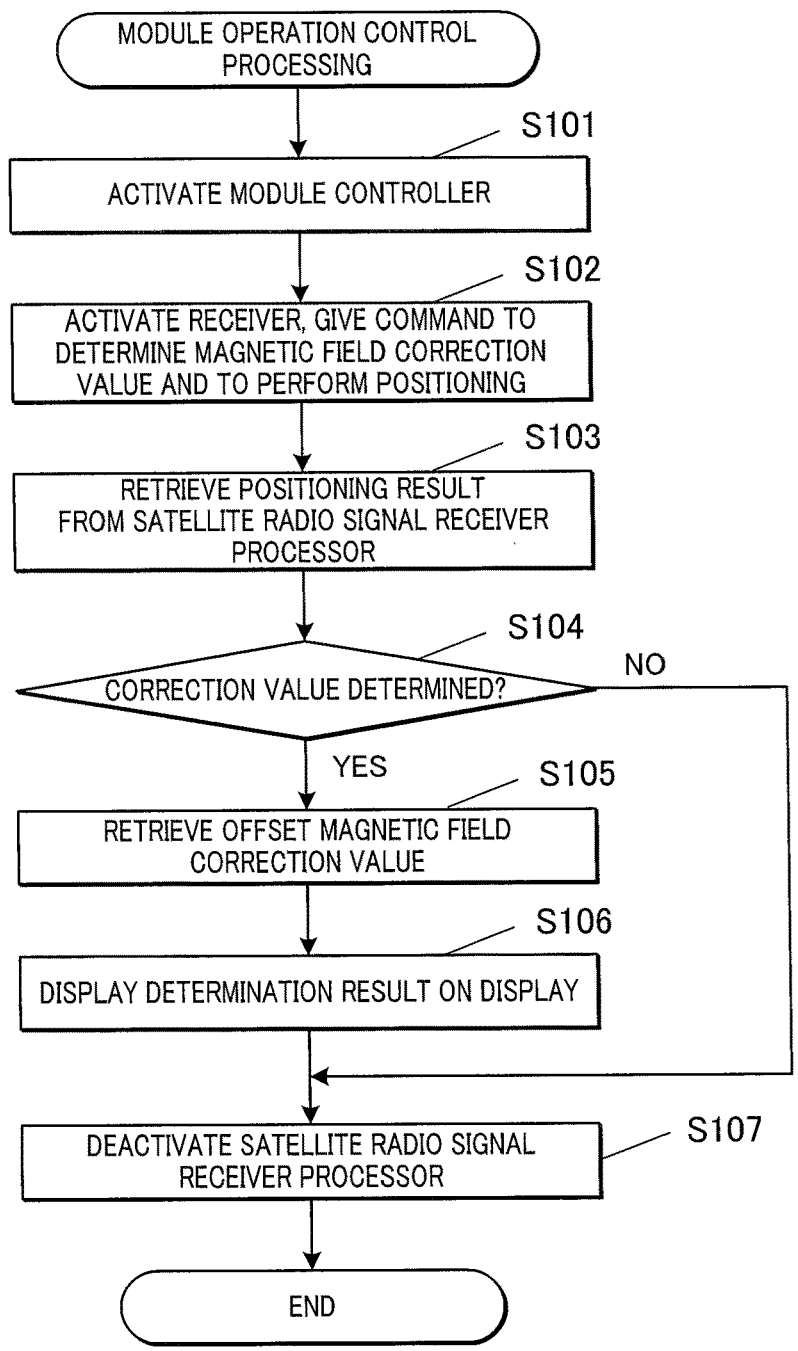
FIG. 2 is a flowchart of the control process of module operation control processing, which is performed by a module controller.

FIG. 2 is a flowchart of module operation control processing that is performed by the electronic timepiece 1 of the embodiment, illustrating the control process by the host CPU 41.

In the module operation control processing, the host CPU 41 activates the module controller 52 when a predetermined condition is met and makes it perform magnetic field correction processing to determine the offset magnetic field along with a positioning operation that is based on a radio signal received from a positioning satellite.

At the start of the module operation control processing, the host CPU 41 (host controller 401) activates the module controller 52 (Step S101). The host CPU 41 activates the receiver 51 and sends a command to the module controller 52 to make it perform the determination of the correction values of the offset magnetic field and the positioning operation (predetermined processing) in parallel (Step S102).

The host CPU 41 waits for a signal input from the satellite radio signal receiver processor 50 and receives a positioning result (Step S103). The host CPU 41 makes a determination as to whether the correction values have been determined by the satellite radio signal receiver processor 50 (Step S104). If it is determined that the correction values have not been determined (Step S104, No), the process by the host CPU 41 continues with Step S107.

If it is determined that the correction values are determined (Step S104, Yes), the host CPU 41 retrieves the correction values of the offset magnetic field from the module CPU 521 and stores them in the RAM 42 as the magnetic field correction values 421 (Step S105). The host CPU 41 sends a control signal to the display 62 to display the retrieved result on the display 62 (Step S106). Then, the process by the host CPU 41 continues with Step S107.

Continuing with Step S107, the host CPU 41 stops power supply to the satellite radio signal receiver processor 50 (Step S107). Then, after a predetermined time since the host CPU 41 starts displaying the result on the display 62, the module operation control processing ends.

Figure 3:
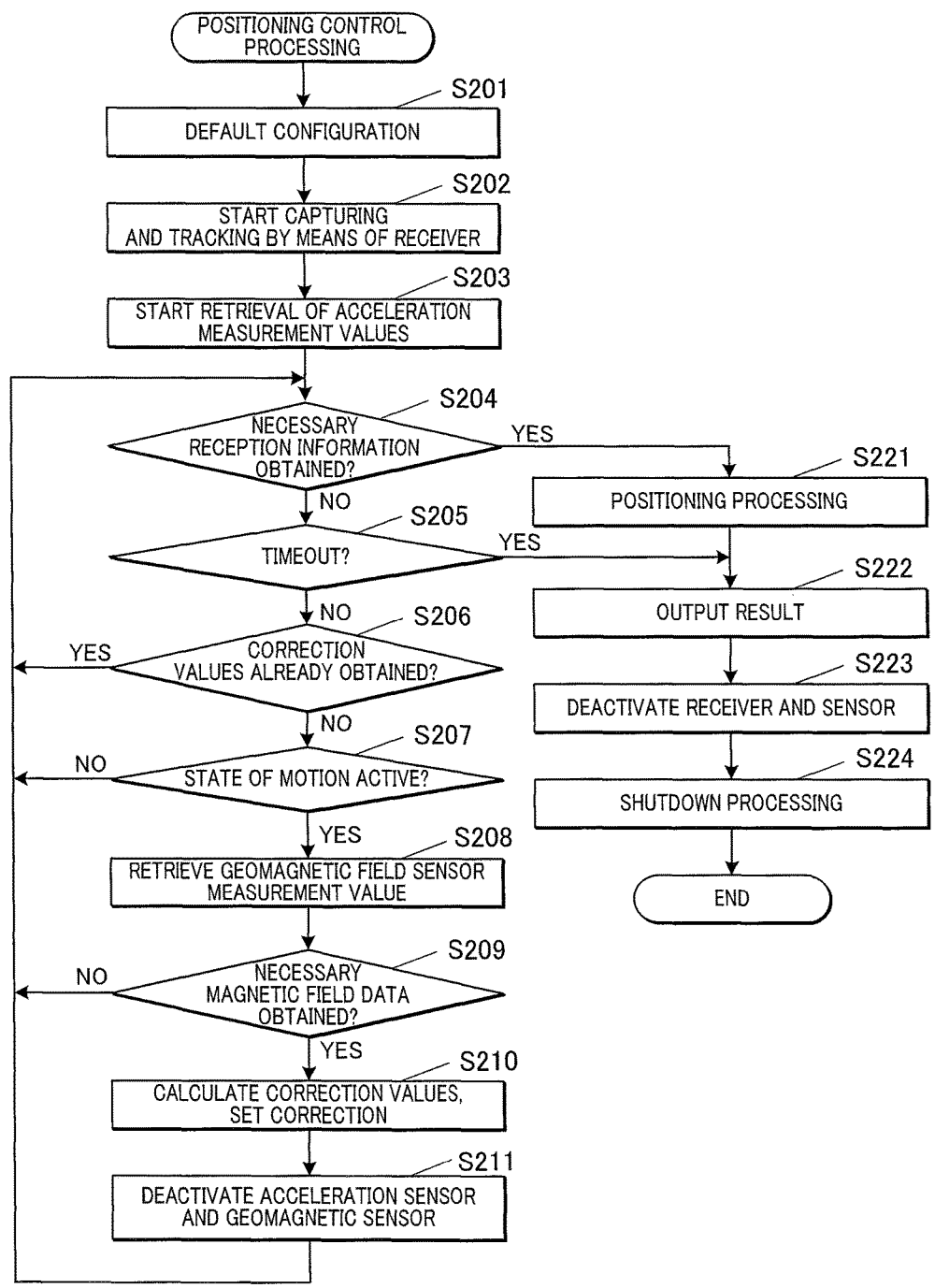
FIG. 3 is a flowchart of the control process of positioning control processing, which is performed by a satellite radio signal receiver processor.

FIG. 3 is a flowchart of the positioning control processing (magnetic field correction setting step, magnetic field correction setting means) that is performed by the satellite radio signal receiver processor 50 activated by the host CPU 41, illustrating the control process by the module CPU 521 (module controller 52).

At the start of the positioning control processing, the module CPU 521 (module controller 52) enables start-up default configuration (Step S201). The module CPU 521 makes the activated receiver 51 start the capturing operation of a satellite radio signal and the tracking operation of the captured satellite radio signal (Step S202). The module CPU 521 starts obtaining acceleration measurement values by means of the acceleration sensor 65 (Step S203).

The module CPU 521 makes a determination as to whether necessary reception information for positioning has been obtained from the radio signal of the tracking satellite (Step S204). If it is determined that necessary information has not been obtained (Step S204, No), the module CPU 521 makes a determination as to whether the timeout period of continuously receiving the satellite radio signal has been passed, i.e. a predetermined time limit is over (Step S205). If it is determined that the timeout period has been passed (Step S205, Yes), the process by the module CPU 521 continues with Step S222.

If it is determined that the predetermined time limit is not over, i.e. the timeout period is not passed yet (within the predetermined time) (Step S205, No), the module CPU 521 makes a determination as to whether the correction values of the offset magnetic field has been already determined and retrieved (Step S206). If it is determined that the correction values has been already retrieved (Step S206, Yes), the process by the module CPU 521 returns to Step S204.

If it is determined that the correction values are not retrieved yet (Step S206, No), the module CPU 521 makes a determination as to whether the state of motion of the electronic timepiece 1 is active based on the measurement value by the acceleration sensor 65 (Step S207). As used herein, being active means that a movement or vibration along with a change of posture is detected at a predetermined level or more based on a change of the acceleration after the start of obtaining of the acceleration measurement value in Step S203. That is, once it is determined that the state of motion becomes active, the determination as being active is held in the following steps.

If it is determined that the state of motion is not active (Step S207, No), the process by the module CPU 521 returns to Step S204. If it is determined that the state of motion is active (Step S207, Yes), the module CPU 521 retrieves measurement values from the geomagnetic sensor (Step S208). The module CPU 521 makes a determination as to whether magnetic field data necessary for calculating the correction values of the offset magnetic field has been obtained (Step S209). That is, the module CPU 521 makes a determination as to whether the number of measurement data is equal to or greater than a predetermined number (minimum number of measurement) and the distribution of the magnetic field vectors is at a predetermined level or more. As for the criteria, a level well-known in the art as necessary for calculating correction values is suitably set as the predetermined level. For example, a whole sphere is divided into directions at predetermined solid angles, and the level is determined from the number (or percentage) of directions that include a measured magnetic field vector among the divided directions. When the display resolution is set as described above, the required accuracy of the correction values is changed according to the detection accuracy of the magnetic north that corresponds to the display resolution. Accordingly, the predetermined level is changed similarly according to the display resolution.

If it is determined that the necessary magnetic field data is not obtained (Step S209, No), the process by the module CPU 521 returns to Step S204. If it is determined that the necessary magnetic field data is obtained (Step S209, Yes), the module CPU 521 calculates the correction values of the offset magnetic field from the magnetic field data and configures the setting for the correction (Step S210). The module CPU 521 deactivates the acceleration sensor 65 and the geomagnetic sensor 64 to stop obtainment of the measurement values (Step S211). Then, the process by the module CPU 521 returns to Step S204.

In the determination in Step S204, if it is determined that the reception information necessary for the positioning is obtained from the satellite radio signal (Step S204, Yes), the module CPU 521 performs positioning processing based on the obtained reception information (Step S221). The positioning processing is well-known in the art, and various improved algorithms known in the art may be employed. Then, the process by the module CPU 521 continues with Step S222.

When the process proceeds from Step S221 or Step S205 to Step S222, the module CPU 521 outputs the obtained positioning result to the host CPU 41. Then, when the correction values of the offset magnetic field are already determined, the module CPU 521 also output them to the host CPU 41 (Step S222). The module CPU 521 stops the receiving operation of the receiver 51. Further, when the geomagnetic sensor 64 and the acceleration sensor 65 are still in operation, the module CPU 521 deactivates them and stops obtainment of the measurement values (Step S223). The module CPU 521 performs a shutdown operation to stop its own operation (Step S224) so that the positioning control processing ends.

Figure 4:
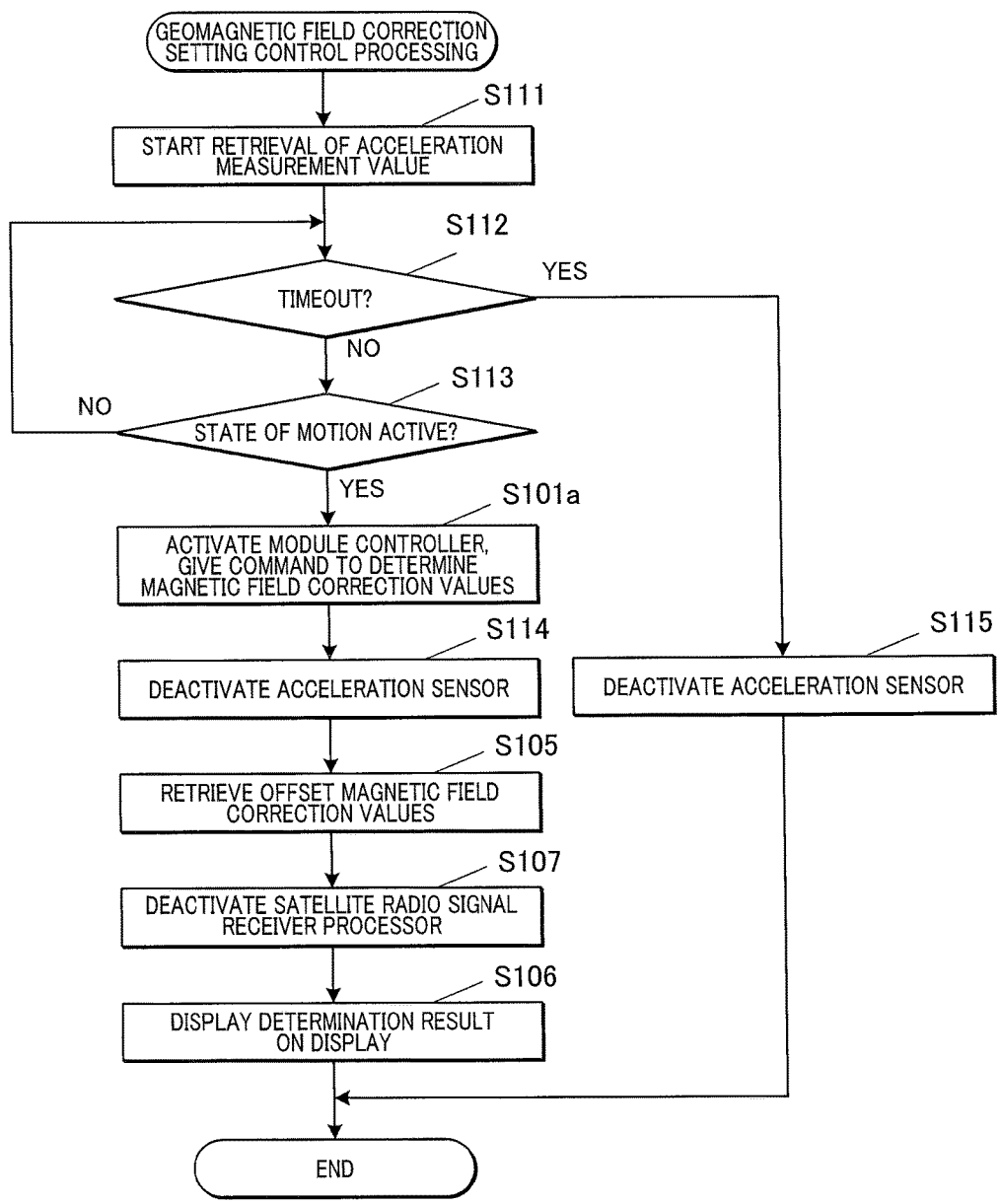
FIG. 4 is a flowchart of the control process of magnetic field correction setting control processing, which is performed by a host controller.

FIG. 4 is a flowchart of magnetic field correction setting control processing that is performed by the electronic timepiece 1 of the embodiment, illustrating the control process by the host CPU 41.

The magnetic field correction setting control processing is started independently from the positioning operation when a predetermined condition for determining the correction values is met. For example, the predetermined condition is such that a predetermined time has elapsed since the last correction, and the voltage of the electric power supplied from the power supply 70 is equal to or greater than a predetermined value. Alternatively or additionally, the predetermined condition may be such that a user operation on the operation interface 61 of a command to perform a magnetic field correction setting operation is detected.

The magnetic field correction setting control processing is the same as the above-described module operation control processing except that Step 101 is replaced with Step S101a, and Step S111 to Step S115 are added in place of Step S102 to S104. The same reference signs are denoted to the other same steps, and the detailed description thereof is omitted.

At the start of the magnetic field correction setting control processing, the host CPU 41 starts activates the acceleration sensor 65 and starts retrieval of the measurement value (Step S111). The host CPU 41 makes a determination as to whether a predetermined time limit is over, i.e. the timeout period has been passed, since the start of retrieving the measurement value from the acceleration sensor 65 (Step S112). If it is determined that the predetermined time limit is not over, i.e. the timeout has not been passed yet (within the predetermined time) (Step S112, No), the host CPU 41 performs the above-described motion determination (Step S113). Corresponding to the difference in processing capability, the sampling rate of the retrieval of the acceleration measurement values and the specific criterion for determining the state of motion that are performed by the host CPU 41 may be different from the sampling rate of the retrieval and the criterion for determining the state of motion that are performed by the module CPU 521. If it is determined that the state of motion is not active (Step S113, No), the process by the host CPU 41 return to Step S112.

If it is determined that the state of motion is active (Step S113, Yes), the host CPU 41 makes the power supply 70 supply electric power to the module controller 52 of the satellite radio signal receiver processor 50 so as to activate the module controller 52. The host CPU 41 sends a command to determine the correction values of the offset magnetic field to the activated module controller 52 (module CPU 521) (Step S101a). Further, the host CPU 41 deactivates the acceleration sensor 65 and stops the retrieval of the measurement values (Step S114). Then, the process by the host CPU 41 continues with Step S105.

When the host CPU 41 retrieves the determined correction values of the offset magnetic field in Step S105, it deactivates the satellite radio signal receiver processor 50 after the shutdown operation of the module CPU 521 (Step S107) and then sends a control signal to the display 62 to display the obtained result on the display 62 (Step S106). After the host CPU 41 displays the obtained result on the display 62 for a predetermined time, the magnetic field correction setting control processing ends.

In the determination in Step S112, if it is determined that the predetermined time limit is over, i.e. the timeout period is passed (Step S112, Yes), the host CPU 41 deactivates the acceleration sensor 65 and stops the retrieval of the measurement values (Step S115). Then, the magnetic field correction setting control processing ends.

Figure 5:
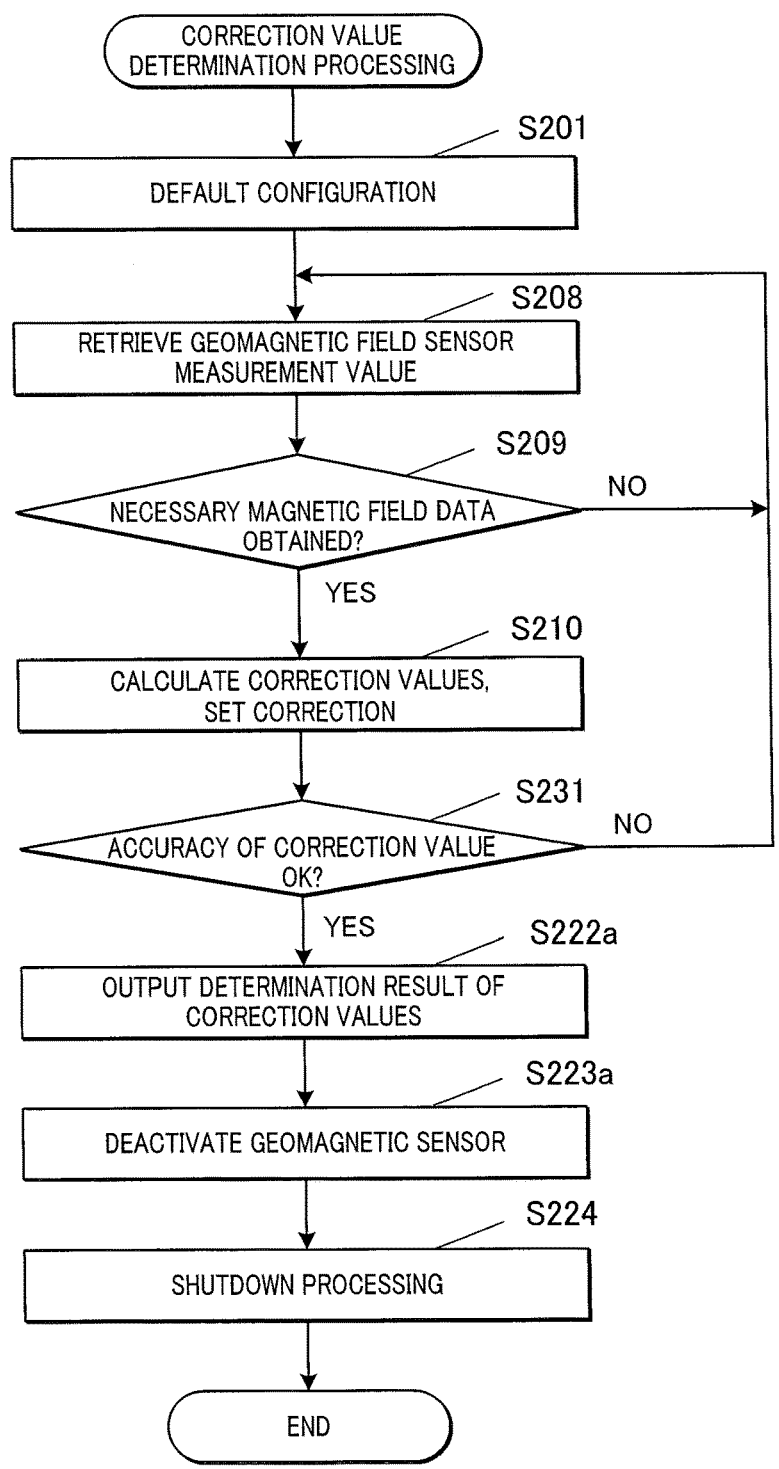
FIG. 5 is a flowchart of the control process of correction value determination processing, which is performed by a module controller.

FIG. 5 is a flowchart of correction value determination processing that is performed by the electronic timepiece 1 of the embodiment, illustrating the control process by the module CPU 521.

The correction value determination processing starts when the module CPU 521 is activated according to a command that is sent from the host CPU 41 in Step S101a of the above-described magnetic field correction setting control processing.

The correction value determination processing is the same as the above-described positioning control processing except that Step S202 to Step S207 and Step S221 are omitted, Step S222 and Step S223 are replaced respectively with Step S222a and Step S223a, and Step S231 is added. Accordingly, the same reference signs are added to the same steps, and the detailed description thereof is omitted.

After Step S201, the process by the module CPU 521 continues with Step S208. Subsequent to Step S210, the module CPU 521 makes a determination as to whether the accuracy of the determined correction values of the offset magnetic field meets a predetermined criterion (whether the accuracy is OK) (Step S231). If it is determined that the predetermined criterion is not met (Step S231, No), the process by the module CPU 521 returns to Step S208 where a required number of magnetic field data for calculating the correction values of the offset magnetic field are additionally obtained again.

If it is determined that the accuracy of the offset values satisfies the predetermined criterion (Step S231, Yes), the module CPU 521 outputs the determination result of the correction values to the host CPU 41 (Step S222a). Further, the module CPU 521 deactivates the geomagnetic sensor 64 and stops the retrieval of the measurement values (Step S223a). Then, the process by the module CPU 521 continues with Step S224, and thereafter the correction value determination processing ends.

Variation

Next, a variation of the positioning control processing will be described, which is performed by the satellite radio signal receiver processor 50 of the electronic timepiece 1 of the embodiment.

When the satellite radio signal receiver processor determines the correction values in parallel to performing the positioning operation, the positioning operation may sometimes end before the required number of the measurement values of the magnetic field are obtained at different postures. This may occur depending on the state of motion of the user (electronic timepiece 1). In such cases, the obtained measurement values of the magnetic field may be stored in the storage 53 so that they can be read out and used in the next determination of the correction values. In this configuration, if the stored values are used without any limitation, there is a chance that the actual correction values change between the two operations. To address this, the usage of the stored values is disabled in a predetermined condition.

FIG. 6 is a flowchart of a variation of the control process of the positioning control processing that is performed by the satellite radio signal receiver processor 50 of the electronic timepiece 1 of the embodiment.

Compared to the above-described positioning control processing in FIG. 3, this positioning control processing involves additional Step S251, Step S252, Step S261 and Step S262 while the other steps are the same. Accordingly, the same reference signs are denoted to the same steps, and the detailed description thereof is omitted.

In the determination in Step S207, if it is determined that the state of motion is active (Step S207, Yes), the module CPU 521 makes a determination as to whether there is unused magnetic field data in the storage 53 that has not been used for determination of the offset magnetic field and was obtained within a predetermined time from the current date and time (within the expiry time) (Step S251). If it is determined that there is no such data (Step S251, No), the process by the module CPU 521 continues with Step S208. If it is determined that there is such data (Step S251, Yes), the module CPU 521 reads out the unused magnetic field data from the storage 53 (Step S252). Then, the process by the module CPU 521 continues with Step S208.

After the positioning result is output in Step S222, the module CPU 521 makes a determination as to whether there is unused magnetic field data that was obtained in the measurement but was not used for the determination of the correction values of the offset magnetic field (Step S261). If there is no such data (Step S261, No), the process by the module CPU 521 continues with Step S223. If there is such data (Step S261, Yes), the module CPU 521 stores the unused magnetic field data in the storage 53 along with the current date and time information (Step S262). Then, the process by the module CPU 521 continues with Step S223.

Further, when unused magnetic field data is read out in Step S252, the module CPU 521 may calculate the correction values respectively with and without the read magnetic field data in Step S210 instead of simply calculating the comprehensive correction values of the offset magnetic field. The module CPU 521 makes a determination as to whether the difference between the two results is equal to or greater than a reference angle. If so, the usage of the correction values is disabled. In this configuration, the determination condition in Step S209 may be suitably configured so that the measurement of the magnetic field is continued until the calculation of the correction values of the offset magnetic field becomes possible even without the stored data.

As described above, the electronic timepiece 1 with the magnetic field measuring apparatus of the embodiment includes: the host controller 401; the module controller 52 which has higher processing capability than the host controller 401; the acceleration sensor 65 which measures the state of motion of the electronic timepiece 1; and the geomagnetic sensor 64 which measures the magnetic field, wherein the host controller 401 makes the module controller 52 perform a certain processing, and wherein when the state of motion measured by the acceleration sensor 65 is at a predetermined level or more, the module controller 52 performs the magnetic field correction setting operation as the certain processing, in which the magnetic field correction setting operation involves retrieving measurement values of the magnetic field from the geomagnetic sensor 64 that are measured at different postures according to a change of the state of motion and determining an offset correction value for the geomagnetic field based on the measurement values.

This enables setting the offset correction values of the magnetic field readily and suitably by utilizing a user movement without asking the user of a labor such as intentionally rotating the electronic timepiece 1. Further, the calculation of the offset values is performed by the module controller 52 that has high processing capability. This enables the calculation to be performed in a short time, and it is therefore possible to efficiently obtain a lot of data from a swing of the user arm or the like to determine the offset correction values. Further, since the module controller 52 is temporarily called and operated, the power consumption is not unnecessarily increased. Further, since the host CPU 41 is not overloaded beyond its performance, the determination of the offset correction values does not have a negative influence on a continuous process by the host CPU 41. Therefore, suitable correction data for a measured magnetic field can be obtained efficiently with a less burden on the user.

The host controller 401 retrieves measurement values from the acceleration sensor 65 and makes a determination as to whether the state of motion is active, and if it is determined that the state of motion is active, the host controller 401 makes the module controller 52 perform the magnetic field correction setting operation. That is, since the magnetic field correction setting operation by the module controller 52 is started after the host controller 401 detects a motion of the user, it is not required to operate the module controller 52 longer than necessary. This enables obtaining suitable correction data for a measured magnetic field while improving the power consumption efficiency.

The host controller 401 starts the retrieval of the measurement values of the acceleration sensor 65 when a predetermined condition is met, and makes the module controller 52 perform the magnetic field correction setting operation when it is determined that the state of motion is active in a predetermined time since the start of the retrieval.

In this way, since the determination operation is performed only when the predetermined condition is met that defines suitable intervals, a suitable power condition, a response to a user request or the like, the determination of the offset correction values is not performed more frequently than necessary. This enables setting suitable offset correction values without consuming electric power more than necessary.

If it is determined that the state of motion is active while the module controller 52 is performing predetermined processing, i.e. positioning processing, the module controller 52 performs the magnetic field correction setting operation in parallel to the predetermined processing.

In this way, since the module controller 52 obtains the offset correction values in parallel to other processing, it is not required to activate the module controller 52 more than necessary. This enables obtaining offset correction values more efficiently.

When the number of measurement values of the magnetic field that are retrieved from the geomagnetic sensor 64 during execution of positioning processing is less than the minimum number of measurement values necessary for calculating the offset correction value with a set accuracy, the module controller 52 stores the obtained measurement values and reads out and uses the stored measurement values in a next magnetic field correction setting operation. This enables obtaining required magnetic field measurement data collectively to calculate the offset correction values without wasting the data that is obtained when the reception and processing time of a satellite radio signal is short or when the state of motion is active only in a short time, for example, when only time information is obtained.

When there are stored previously-retrieved measurement values at the time of the magnetic field correction setting operation, the module controller 52 makes a determination as to whether to use the previously-retrieved measurement values based on an elapsed time since the retrieval of the previously-retrieved measurement values.

As described above, while the offset magnetic field does not change to a great degree in a short period when there is no cause of change, the probability of encountering a cause of change increases as the elapsed time increases. Therefore, the probability of using data that is obtained in different offset magnetic fields can be reduced by avoiding a combined usage of old data, which has a long elapsed time since the obtainment, with new data. When the operation of determining the correction values of the offset magnetic field can be performed periodically and automatically as in the electronic timepiece 1 of the embodiment, it is possible to set shorter operation intervals than usual. This enables effectively using unused data that was previously obtained.

The host controller 401 is capable of changing the accuracy of geomagnetic field direction measured by the geomagnetic sensor 64 and sets determination accuracy of the offset correction value according to the accuracy of the geomagnetic field direction. When high accuracy is not required in measuring and displaying the magnetic field, high accuracy is not required also for the correction values. Therefore, it is possible to determine correction values of an offset magnetic field efficiently in a shorter time and then to re-calculate more accurate correction values of the offset magnetic field when an active state of motion is detected that includes a continuous motion over a wide area or when plural times of magnetic field measurements can be accumulated.

The electronic timepiece 1 includes the receiver 51 which receives a satellite radio signal, wherein the module controller 52 performs positioning processing based on positioning information included in the received satellite radio signal as one of the certain processing that the host controller 401 makes the module controller 52 perform.

As described above, it is possible to calculate the correction values of the offset magnetic field by using a controller (CPU, RAM, etc.) that has processing capability sufficient for positioning. This enables obtaining correction values of an offset magnetic field efficiently in a shorter time compared to the processing by the host controller 401 that has lower processing capability. Therefore, correction values of an offset magnetic field can be obtained in a shorter active state of motion of the user.

The electronic timepiece 1 includes an operation interface 61 which receives a user operation, wherein if it is determined that the state of motion is active in a predetermined time since a command to perform the magnetic field correction setting operation is received by the operation interface 61, the host controller 401 makes the module controller 52 perform the magnetic field correction setting operation.

As described above, the operation of obtaining the correction values of the offset magnetic field may be performed at an arbitrary timing according to a user operation. This enables suitable update of the correction values, for example when encountering a possible cause of change of the correction values. Further, in this case, once a starting user operation is made, a subsequent normal walk with swings of the arm allows obtainment of correction values. This enables reducing a burden on the user.

The acceleration sensor 65 is used to measure the state of motion. Therefore, it is possible to rapidly detect active state at low load with such a simple and small configuration. This enables rapidly switching to magnetic field measurement to obtain the correction value of the offset magnetic field.

The electronic timepiece 1 includes: the above-described magnetic field measuring apparatus; the time counter circuit 48 that counts the current time; and the display 62 which displays the current date and time counted by the time counter circuit 48, wherein the host controller 401 controls the display operation of the display 62. As described above, the electronic timepiece 1, particularly a wrist watch or the like that is carried with the user, can efficiently determine correction values of an offset magnetic field by utilizing swings of the user arm during walk. Since the control of the display 62 for counting and displaying the date and time requires very low processing capability, it is not necessary to impart such high performance to the host controller 401 that is necessary for determining the correction values of the offset magnetic field, but the module controller 52 having high computing performance can be configured to perform the magnetic field correction setting operation instead. This enables determining and obtaining the correction values efficiently with proper power consumption.

The host controller 401 calculates the direction of the magnetic north component in the plane of the display panel of the display 62 based on the geomagnetic field that is measured by the geomagnetic sensor 64 and then determined by the host controller 401 itself, and displays the calculated direction on the display 62, so that the electronic timepiece 1 can function as an electronic compass.

As described above, such low-load processing is performed by the host controller 401. This enables readily imparting multiple functions to the electronic timepiece 1 with lower power consumption.

In the magnetic field measuring apparatus that includes: the host controller 401; the module controller 52 which has higher processing capability than the host controller 401; the acceleration sensor 65 which measures the state of motion of the apparatus; and the geomagnetic sensor 64 which measures the magnetic field, wherein the host controller 401 makes the module controller 52 perform a certain processing, a method of setting correction of a measured magnetic field is used which involves: performing a magnetic field correction setting operation when the state of motion measured by the acceleration sensor 65 is active, in which the magnetic field correction setting operation is performed by the module controller 52 and involves retrieving measurement values of the magnetic field from the geomagnetic sensor 64 that are measured at different postures according to a change of the state of motion and determining the offset correction value for the geomagnetic field based on the retrieved measurement values. Therefore, suitable correction data for the measured magnetic field can be efficiently obtained with a less burden on the user.

The program 661 for the above-described magnetic field correction setting operation is installed in the ROM 66, and the program is executed by a computer that includes the host controller 401, the module controller 52, the acceleration sensor 65 and the geomagnetic sensor 64, in which the host controller 401 makes the module controller 52 perform a certain processing. Therefore, suitable correction data for the measured magnetic field can be efficiently obtained with a less burden on the user.

The present invention is not limited to the above-described embodiment, and various changes can be made.

For example, in the above-described embodiment, the module controller 52 of the satellite radio signal receiver processor 50 is configured to temporarily perform the processing of the magnetic field correction setting operation. Instead, another controller that is intended to mainly perform certain different processing may be configured to perform the processing of the magnetic field correction setting operation. Alternatively, a universal controller for unspecified high-load processing may be provided independently from the host controller 401.

In the above-described embodiment, the processing capability of the host CPU 41 of the host controller 401 is lower than that of the module CPU 521 of the module controller 52, and the capacity of the RAM 42 of the host controller 401 is lower than that of the non-volatile memory of the memory 522. However, it is not necessary to impart both configurations, and any configuration is possible that enables the module controller 52 to perform the processing of the magnetic field correction setting operation faster than the host controller 401 without causing any overload.

In the above-described embodiment, the geomagnetic sensor 64 is provided that is intended to measure the geomagnetic field. Instead, it is possible to provide a different magnetic field sensor that is intended to measure the magnetic field developed by a local magnetic source or an artificial magnetic field and has a different measurable range of magnetic field intensity as long as the precision of the sensor is sufficient for the known determination method of the offset magnetic field that is used in the embodiment. Even in such cases, it is preferred to use measurement data of the geomagnetic field in the magnetic field correction setting operation. Therefore, it is preferred that the measurable range covers the ordinary geomagnetic field, and a determination as to whether the offset magnetic field has been determined is made by strictly evaluating the calculation accuracy in calculating the correction values.

In the above-described embodiment, the state of motion is measured by means of an acceleration sensor 65. However, the present invention is not limited thereto. Further, the output of the geomagnetic sensor 64 itself may be considered to estimate the state of motion.

In the above-described embodiment, the magnetic field correction setting operation can be always performed according to an input of a user operation. However, a suitable condition may be set so that at least a predetermined time interval is secured between the setting operations according to the power supply condition and the like even when a user operation is detected.

The above-described embodiment illustrates an example in which the offset magnetic field is determined with regard to the measurement values of the geomagnetic field obtained by the geomagnetic sensor 64 installed in the electronic timepiece 1. However, the present invention is applicable to other electronic devices as well as the electronic timepiece 1. For example, the present invention is applicable to pedometers, activity trackers and the like that can measure the bearing.

The measured magnetic field may be used not only for displaying the magnetic north as a part of the function as an electronic compass but also for other usages such as navigation in which the direction of a preset navigation route is indicated.

Regarding the program 661, it includes at least a description of the process in the module controller 52 that is performed by the module CPU 521. The host CPU 41 may be independently configured to be able to make the module CPU 521 execute the program 661 according to the above-described condition.

Regarding the display 62, the configuration thereof is not limited to that of a digital display. For example, the configuration may be such that an indicating needle or a rotating plate may be rotated so that a predetermined location is indicated and/or a predetermined sign is exposed.

In the above description, the ROM 66 that is composed of a mask ROM, a volatile memory and the like is exemplified as the computer-readable medium that stores the program 661 for the operation processing such as the tracking control processing that relates to the processing operation of the module controller 52 (second processor). However, the present invention is not limited thereto. An HDD (Hard Disk Drive), a portable recording medium such as a CD-ROM or a DVD disk, or the like is applicable as the computer-readable medium. Further, the present invention also encompasses a carrier wave as a medium for distributing the data of the program of the present invention through a communication line.

A suitable change may be made in the specific details of the configurations, controls, processes and the like described in the above embodiment without departing from the spirit of the present invention.

While some embodiments of the present invention are described, the scope of the present invention is not limited to the above-described embodiments but encompasses the scope of the invention recited in the claims and the scope of the equivalents thereof.

What is claimed is:

1. A magnetic field measuring apparatus comprising:
a first processor;
a second processor having higher processing capability than the first processor;
a motion sensor configured to measure state of motion of the magnetic field measuring apparatus; and
a magnetic field sensor configured to measure a magnetic field,
wherein in response to when it is determined that the state of motion measured by the motion sensor being determined to be at a predetermined level or more, the first processor is configured to instruct the second processor to perform a magnetic field correction setting operation, and
wherein in response to being instructed by the first processor, the second processor is configured to perform the magnetic field correction setting operation comprising:
retrieving measurement values of the magnetic field from the magnetic field sensor which are measured at different postures according to a change of the state of motion; and
determining an offset correction value for a geomagnetic field measured by the magnetic field sensor based on the measurement values.

2. The magnetic field measuring apparatus according to claim 1,
wherein the first processor is configured to:
retrieve the state of motion from the motion sensor; and
determine whether the state of motion is at the predetermined level or more.

3. The magnetic field measuring apparatus according to claim 2,
wherein the first processor is configured to:
determine whether a predetermined condition is met;
in response to determining that the predetermined condition is met, start retrieval of the state of motion from the motion sensor;
determine whether the state of motion is at the predetermined level or more within a predetermined time since the start of the retrieval; and
in response to determining that the state of motion is at the predetermined level or more within the predetermined time since the start of the retrieval, instruct the second processor to perform the magnetic field correction setting operation.

4. The magnetic field measuring apparatus according to claim 3,
wherein the second processor is configured to:
determine whether the state of motion is at the predetermined level or more while the second processor is performing predetermined processing; and
in response to the state of motion being determined to be at the predetermined level or more while the second processor is performing the predetermined processing, perform the magnetic field correction setting operation in parallel to the predetermined processing.

5. The magnetic field measuring apparatus according to claim 4,
wherein the second processor is configured to:
determine whether the number of measurement values of the magnetic field which are retrieved from magnetic field sensor while the second processor is performing the predetermined processing is less than a minimum number of measurement values necessary for calculating the offset correction value with a set accuracy; and
in response to determining that the number of measurement values of the magnetic field is less than the minimum number:
store the obtained measurement values of the magnetic field retrieved from the magnetic field sensor; and
read out and use the measurement values of the magnetic field stored in a next magnetic field correction setting operation.

6. The magnetic field measuring apparatus according to claim 5,
wherein the second processor is configured to:
determine whether there are stored previously-retrieved measurement values at the time of the magnetic field correction setting operation; and
in response to determining that there are stored previously-retrieved measurement values at the time of the magnetic field correction setting operation, determine whether to use the previously-retrieved measurement values based on an elapsed time since retrieval of the previously-retrieved measurement values.

7. The magnetic field measuring apparatus according to claim 2,
wherein the second processor is configured to:
determine whether the state of motion is at the predetermined level or more while the second processor is performing predetermined processing; and
in response to the state of motion being determined to be at the predetermined level or more while the second processor is performing the predetermined processing, perform the magnetic field correction setting operation in parallel to the predetermined processing.

8. The magnetic field measuring apparatus according to claim 7,
wherein the second processor is configured to:
determine whether the number of measurement values of the magnetic field which are retrieved from the magnetic field sensor while the second processor is performing the predetermined processing is less than a minimum number of measurement values necessary for calculating the offset correction value with a set accuracy; and
in response to determining that the number of measurement values of the magnetic field is less than the minimum number:
store the measurement values of the magnetic field retrieved from the magnetic field sensor; and
read out and use the measurement values of the magnetic field stored in a next magnetic field correction setting operation.

9. The magnetic field measuring apparatus according to claim 8,
wherein the second processor is configured to:
determine whether there are stored previously-retrieved measurement values at the time of the magnetic field correction setting operation; and
in response to determining that there are stored previously-retrieved measurement values at the time of the magnetic field correction setting operation, determine whether to use the previously-retrieved measurement values based on an elapsed time since retrieval of the previously-retrieved measurement values.

10. The magnetic field measuring apparatus according to claim 1,
wherein the second processor is configured to:
determine whether the state of motion is at the predetermined level or more while the second processor is performing predetermined processing; and
in response to the state of motion being determined to be at the predetermined level or more while the second processor is performing the predetermined processing, perform the magnetic field correction setting operation in parallel to the predetermined processing.

11. The magnetic field measuring apparatus according to claim 10,
wherein the second processor is configured to:
determine whether the number of measurement values of the magnetic field which are retrieved from the magnetic field sensor while the second processor is performing the predetermined processing is less than a minimum number of measurement values necessary for calculating the offset correction value with a set accuracy; and
in response to determining that the number of measurement values of the magnetic field is less than the minimum number:
store the measurement values of the magnetic field retrieved from the magnetic field sensor; and
read out and use the measurement values of the magnetic field stored in a next magnetic field correction setting operation.

12. The magnetic field measuring apparatus according to claim 11,
wherein the second processor is configured to:
determine whether there are stored previously-retrieved measurement values at the time of the magnetic field correction setting operation; and
in response to determining that there are stored previously-retrieved measurement values at the time of the magnetic field correction setting operation, determine whether to use the previously-retrieved measurement values based on an elapsed time since retrieval of the previously-retrieved measurement values.

13. The magnetic field measuring apparatus according to claim 1,
wherein the first processor is configured to:
change accuracy of a direction of the geomagnetic field measured by the magnetic field sensor; and
set determination accuracy of the offset correction value according to the accuracy of the direction of the geomagnetic field.

14. The magnetic field measuring apparatus according to claim 1, further comprising:
a receiver configured to receive a satellite radio signal,
wherein the first processor is configured to instruct the second processor to perform positioning based on positioning information included in the satellite radio signal received, and
wherein in response to being instructed by the first processor, the second processor is configured to perform the positioning based on the positioning information included in the satellite radio signal received.

15. The magnetic field measuring apparatus according to claim 1, further comprising:
an operation interface configured to receive a user operation,
wherein in response to the state of motion being determined to be at the predetermined level or more within a predetermined time since a command to perform the magnetic field correction setting operation is received by the operation interface, the first processor is configured to instruct the second processor to perform the magnetic field correction setting operation.

16. The magnetic field measuring apparatus according to claim 1,
wherein the motion sensor comprises an acceleration sensor.

17. An electronic timepiece comprising:
the magnetic field measuring apparatus according to claim 1;
a time counter circuit configured to count current time; and
a display configured to display the current time counted by the time counter circuit,
wherein the first processor is configured to control displaying operation of the display.

18. The electronic timepiece according to claim 17,
wherein the first processor is configured to:
calculate a direction of a magnetic north component in a plane of a display panel of the display based on the geomagnetic field determined by the magnetic field measuring apparatus; and
control the display to display the direction calculated.

19. A method for controlling a magnetic field measuring apparatus, wherein the magnetic field measuring apparatus comprises:
a first processor;
a second processor having higher processing capability than the first processor;
a motion sensor configured to measure state of motion of the magnetic field measuring apparatus; and
a magnetic field sensor configured to measure a magnetic field,
the method comprising:
in response to the state of motion measured by the motion sensor being determined to be at a predetermined level or more, instructing, by the first processor, the second processor to perform a magnetic field correction setting operation; and
in response to being instructed by the first processor, performing, by the second processor, the magnetic field correction setting operation comprising:
retrieving measurement values of the magnetic field from the magnetic field sensor which are measured at different postures according to a change of the state of motion; and
determining an offset correction value for a geomagnetic field measured by the magnetic field sensor based on the measurement values.

20. A non-transitory computer-readable medium storing a program to be executed by a magnetic field measuring apparatus, wherein the magnetic field measuring apparatus comprises:
a first processor;
a second processor having higher processing capability than the first processor;
a motion sensor configured to measure state of motion of the magnetic field measuring apparatus; and
a magnetic field sensor configured to measure a magnetic field, wherein in response to the state of motion measured by the motion sensor being determined to be at a predetermined level or more, the program causes the first processor to instruct the second processor to perform a magnetic field correction setting operation, and causes the second processor, in response to being instructed by the first processor, to perform the magnetic field correction setting operation comprising:

retrieving measurement values of the magnetic field from the magnetic field sensor which are measured at different postures according to a change of the state of motion; and determining an offset correction value for a geomagnetic field measured by the magnetic field sensor based on the measurement values.

* * * * *

UNITED STATES PATENT AND TRADEMARK OFFICE
CERTIFICATE OF CORRECTION

PATENT NO. : 10,338,154 B2
APPLICATION NO. : 15/660021
DATED : July 2, 2019
INVENTOR(S) : Tatsuya Sekitsuka et al.

It is certified that error appears in the above-identified patent and that said Letters Patent is hereby corrected as shown below:

Column 17, Claim 1, Line 10 should read:
wherein in response to the state

Column 18, Claim 5, Line 7 should read:
store the measurement

Signed and Sealed this
Twenty-ninth Day of October, 2019

Andrei Iancu
*Director of the United States Patent and Trademark Office*